United States Patent
Yamane et al.

(10) Patent No.: US 6,327,165 B1
(45) Date of Patent: Dec. 4, 2001

(54) POWER CONVERSION APPARATUS FOR INTERCHANGEABLY CONVERTING ALTERNATING CURRENT AND DIRECT CURRENT

(75) Inventors: Toshinori Yamane; Hirotoshi Maekawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/604,462

(22) Filed: Jun. 27, 2000

(30) Foreign Application Priority Data

Jan. 13, 2000 (JP) .................................................. 12-004751

(51) Int. Cl.[7] ........................ H02H 7/122; H02M 7/5387
(52) U.S. Cl. ................. 363/132; 363/55; 363/58
(58) Field of Search .................. 363/40, 55, 58, 363/132, 141, 131

(56) References Cited

U.S. PATENT DOCUMENTS

| | | | |
|---|---|---|---|
| 4,355,268 | * 10/1982 | Iwasawa et al. | 318/314 |
| 5,132,896 | 7/1992 | Nishizawa et al. | 363/144 |
| 5,142,439 | 8/1992 | Huggett et al. | 361/321 |
| 5,184,291 | * 2/1993 | Crowe et al. | 363/37 |
| 5,365,424 | * 11/1994 | Deam et al. | 363/144 |
| 5,623,399 | * 4/1997 | Ishii et al. | 363/132 |
| 5,729,450 | * 3/1998 | Dimino et al. | 363/132 |
| 6,115,270 | * 9/2000 | Yamane et al. | 363/141 |

FOREIGN PATENT DOCUMENTS

| | | | |
|---|---|---|---|
| 10-304680 | 11/1998 | (JP) | H02M/7/48 |
| WO 98/04029 | 1/1997 | (WO) | H02M/7/00 |

* cited by examiner

Primary Examiner—Bao Q. Vu
(74) Attorney, Agent, or Firm—Sughrue, Mion, Zinn, Macpeak & Seas, PLLC

(57) ABSTRACT

A power conversion apparatus comprising a switching power module (1) for conducting power conversion in a switching manner, a plurality of smoothing capacitors (6A) for smoothing a direct-current power supply output to be applied to the switching power module (1), and a switching power module connecting wiring board (19) for establishing connection of the smoothing capacitor (6A) to the switching power module (1). A ceramic capacitor is used as the smoothing capacitors (6A). The smoothing capacitors (6A), a smoothing capacitor case (23) accommodating the ceramic capacitors and the switching power module connection wiring board (19) are integrated structurally with each other to construct a smoothing capacitor assembly (24). This smoothing capacitor assembly (24) is connected to the switching power module (1).

5 Claims, 4 Drawing Sheets

POWER CONVERSION APPARATUS FOR INTERCHANGEABLY CONVERTING ALTERNATING CURRENT AND DIRECT CURRENT

BACKGROUND OF THE INVENTION

1. Field of the Invention

The present invention relates to a power conversion apparatus.

2. Description of the Related Art

FIG. 5 is a block diagram showing a circuit arrangement of a known power conversion apparatus for converting direct-current power supply into three-phase alternating current to drive an alternating-current load such as a three-phase alternating-current motor. In FIG. 5, reference numeral 1 designates a switching power module for performing power conversion by means of switching, numeral 7 denotes a battery constituting a direct-current power supply, and numeral 8 depicts an alternating-current load such as a three-phase alternating-current motor. The switching power module 1, for example in the case of an electric vehicle, converts a discharge output (direct current) of the direct-current power supply 7 into a three-phase alternating current for driving the alternating-current load 8 in starting or accelerating the vehicle. On the other hand, in regenerative braking, regenerative power from the alternating-current load 8 is converted from a three-phase alternating current into a direct current, and then returned to the direct-current power supply 7. In the interior of the switching power module 1, contained are switching devices 2 including transistors for power conversion from direct current into three-phase alternating current, IGBTs and MOSFETS, free wheeling diodes 3 for power conversion from three-phase alternating current into direct current, snubber capacitors 4 for restraining surge occurring in the switching device 2 sections at switching operations, and a control circuit section 5 for controlling the switching devices 2. In this case, the major requirement for the snubber capacitors 4 is an excellent frequency characteristic, with a film capacitor being common. Additionally, in FIG. 5, numeral 6 represents a smoothing capacitor for suppressing voltage variation of the direct-current power supply 7 at the switching to smooth the jumping or the like of the voltage. The smoothing capacitor 6 requires a sufficiently large electrostatic capacity; therefore, an aluminium electrolytic capacitor is commonly put to use because a large electrostatic capacity is easily obtainable. Incidentally, the control circuit 5 is a common circuit for controlling the alternating-current load 8 such as a three-phase alternating-current motor, and a detailed illustration thereof will be omitted here.

Furthermore, FIG. 6 is a side-elevational cross-sectional view showing a common internal configuration of a known power conversion apparatus. In FIG. 6, reference numeral 21 designates a case, which contains a packaged switching power module 1, smoothing capacitors 6 and a snubber capacitor substrate 18 holding snubber capacitors 4 (not shown). In general, a wiring (distributing) board 19 such as a copper bus bar or a copper plate is used for establishing the connection between the switching power module 1 and the smoothing capacitors 6, and fixing and electrical connection thereof are made through the use of screws. Additionally, in general, the snubber capacitor substrate 18 is located in the vicinity of positive-electrode (P) and negative-electrode (N) direct-current input wirings (wiring sections) 9p and 9n and a U-phase, V-phase and W-phase alternating-current output wiring (wiring section) 10 on the switching power module 1 and fixed and electrically connected through the use of screws 20 (in this case, exactly, the alternating-current output wiring 10 comprises three output wirings 10u, 10v and 10w corresponding respectively to the U-phase, V-phase and W-phase as shown in FIG. 5, but they are simplified in FIG. 6). Moreover, the package of the switching power module 1 is composed of a resin-made switching power module case 12 accommodating the positive-electrode (P) and negative-electrode (N) direct-current input wirings 9p, 9n, the U-phase, V-phase and W-phase alternating-current output wirings 10u, 10v and 10w and a control circuit substrate connection wiring 11 in an insert molding manner, and a switching power module base plate 13. Still additionally, the package of the switching power module 1 accommodates an insulating substrate 14 such as a ceramic substrate for holding the switching devices 2 and the free wheeling diodes 3, and a control circuit substrate 17 for supporting the control circuit section 5. The switching devices 2 and the free wheeling diodes 3 are fixedly secured on the switching power module base plate 13 through the insulating substrate 14 with an electrically conductive pattern by means of an adhesive material such as a solder, and further connected to the positive-electrode (P) and negative-electrode (N) direct-current input wirings 9p, 9n, the U-phase, V-phase and W-phase alternating-current output wirings 10u, 10v, 10w and the control circuit substrate connection wiring 11 through the use of a connection conductor 15 such as wire bonding. Furthermore, the control circuit substrate 17 is connected electrically to the control circuit substrate connection wiring 11 by means of soldering or the like. Still furthermore, a gel-like filler 16 is put between the insulating substrate 14 and the control circuit substrate 17, and if necessary, a resin such as epoxy can be placed thereon. The gel-like filler 16 is for protecting the switching devices 2, the free wheeling diodes 3 and the connection conductor 15 to prevent the switching devices 2 from failure or malfunction due to humidity or dust. In addition, a cooling member 22, which cools the switching devices 2 using air, water, oil or the like is attached to the case 21 so that the Joule heat generated from the switching devices 2 is radiated through the insulating substrate 14 and the switching power module base plate 13 into the cooling member 22 for cooling the switching devices 2.

In the known power conversion apparatus thus constructed, the smoothing capacitors 6 are required to have an electrostatic capacity large sufficiently to smooth the output of the direct-current power supply 7 to be applied to the switching devices 2, thus their sizes increase generally. Although the smoothing capacitor 6 is made commonly using an aluminium electrolytic capacitor, since its internal resistance is high, the internal heat generation of the smoothing capacitor 6 increases due to the direct-current ripple voltage variation occurring at switching operations. For restraining this heat generation, there is a need to complicate the construction considerably for cooling the smoothing capacitor 6 through the use of the aforesaid cooling member 22 or to further increase its electrostatic capacity. For this reason, in the case of the known power conversion apparatus, the area and volume of the smoothing capacitor 6 enlarge, thus increasing the size of the entire apparatus.

In addition, since the aluminium electrolytic capacitor for use on the smoothing capacitor 6 has disadvantages in that its operating temperature range is narrow and its service time (namely, duration of life) is short from the influence of leakage of electrolyte caused by seal deterioration, thus lowering the reliability.

Still additionally, since the area and volume of the smoothing capacitor 6 are large, a wiring board 19 for the connection between the switching power module 1 and the smoothing capacitor 6 becomes long. Accordingly, the wiring inductance between the switching device 2 and the smoothing capacitor 6 increases, which produces the possibility of generating a large surge at switching to destroy the switching device 2. Thus, a need exists to install a snubber capacitor in the vicinity of the positive-electrode (P) and negative-electrode (N) direct-current input wirings 9p, 9n and the U-phase, V-phase and W-phase alternating-current output wiring 10 on the switching power module 1, which makes the manufacturing process troublesome and increases the cost.

Moreover, in the case of connecting the aluminium electrolytic capacitor to the switching power module connection wiring board 19, there is a need to screw the terminals of every positive electrode (P) and every negative electrode (N) of all of aluminium electrolytic capacitor, which makes fabrication difficult.

SUMMARY OF THE INVENTION

Accordingly, the present invention has been developed in order to solve the aforesaid problems, and it is an object of the invention to provide a power conversion apparatus which is small in size, high in reliability and easy in fabrication.

With the above objects in view, a power conversion apparatus of the present invention comprises a switching power module for conducting power conversion in a switching manner, a smoothing capacitor for smoothing a direct-current power supply output to be applied to the switching power module and a switching power module connecting wiring board for connecting said smoothing capacitor to the switching power module, wherein the smoothing capacitor comprises a ceramic capacitor.

The power conversion apparatus may comprises a smoothing capacitor case accommodating a plurality of ceramic capacitors, wherein the ceramic capacitors, the smoothing capacitor case and the switching power module connection wiring board are integrated structurally with each other to form a smoothing capacitor assembly.

A plurality of smoothing capacitors, a plurality of switching power module connection wiring boards and pluralities of positive-electrode (P) and negative-electrode (N) direct-current input wiring sections may be provided to the number of phases of an alternating-current output, and may be disposed in a divided condition to make sets each being in charge of each of the phases thereof.

BRIEF DESCRIPTION OF THE DRAWINGS

Other object and features of the present invention will become more readily apparent from the following detailed description of the preferred embodiments taken in conjunction with the accompanying drawings in which.

DETAILED DESCRIPTION OF THE INVENTION

First Embodiment

Figure 1:
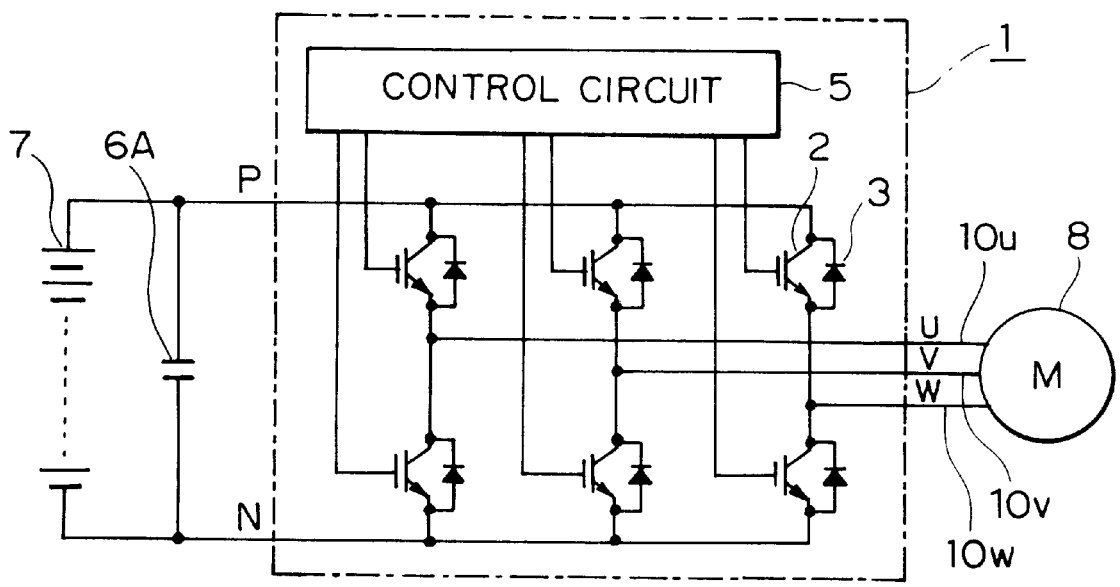
FIG. 1 is a block diagram showing a circuit arrangement of a power conversion apparatus according to a first embodiment of this invention.

Referring to the drawings, a description will be given hereinbelow of a power conversion apparatus according to a first embodiment of the present invention. Although the following description relates to a mode on an inverter for driving a three-phase alternating-current motor or the like, this invention is not limited to this, but is applicable to all power conversion apparatus. Additionally, the same reference numerals are used for those corresponding to the components 1 to 3, 5, 7 to 17 and 19 to 22 in the related art described above, and the description thereof will be omitted for brevity.

Figure 2:
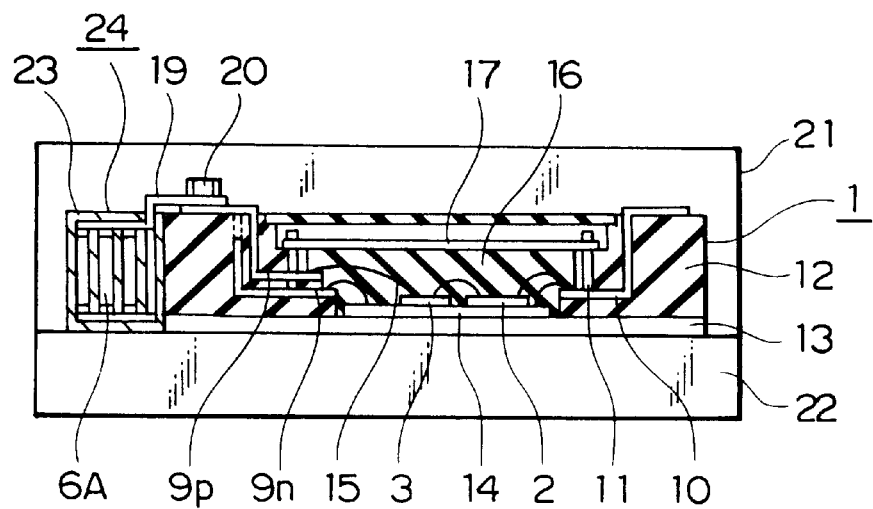
FIG. 2 is a side-elevational and cross-sectional view showing an internal configuration of the power conversion apparatus according to the first embodiment of this invention.
Figure 3:
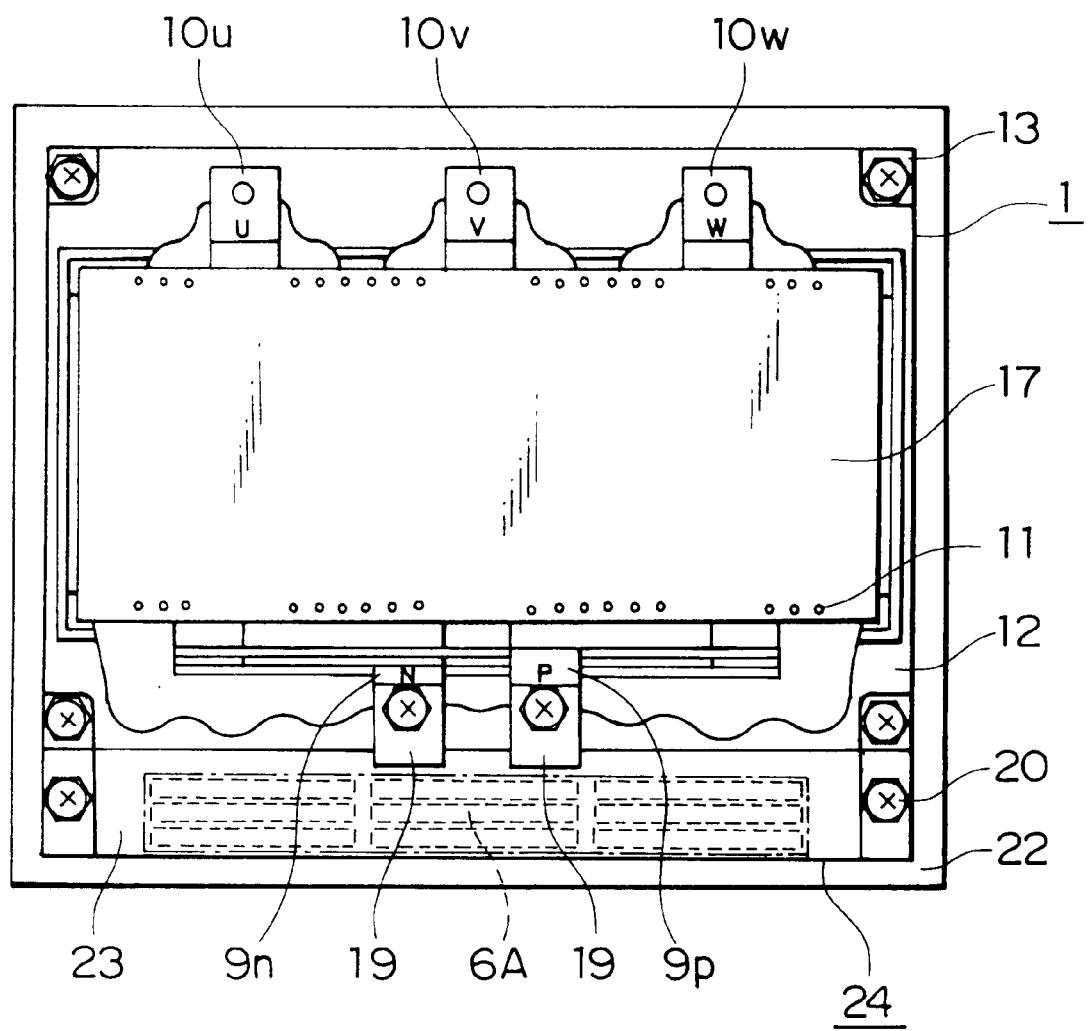
FIG. 3 is a plan view showing an internal configuration of a power conversion apparatus according to the first embodiment of this invention.
Figure 5:
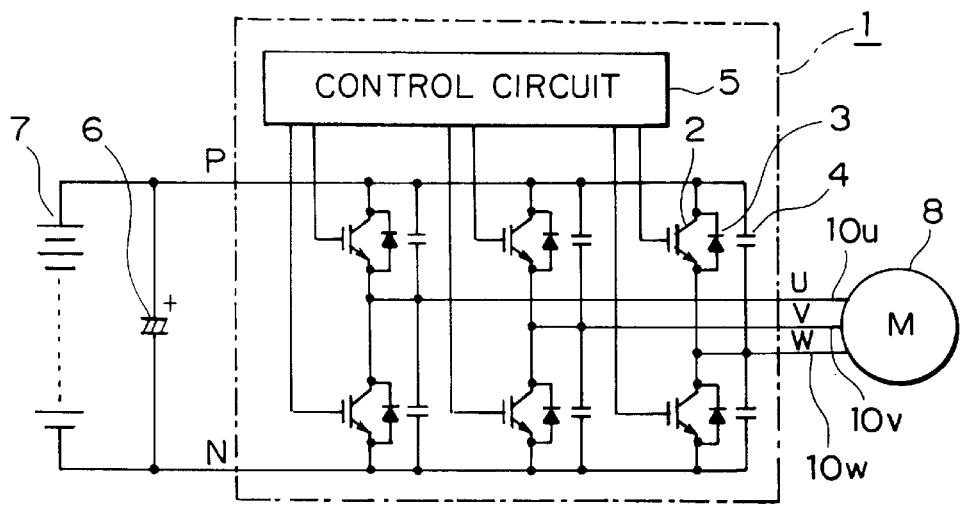
FIG. 5 is a block diagram showing a circuit arrangement of a privately known but unpublished power conversion apparatus.
Figure 6:
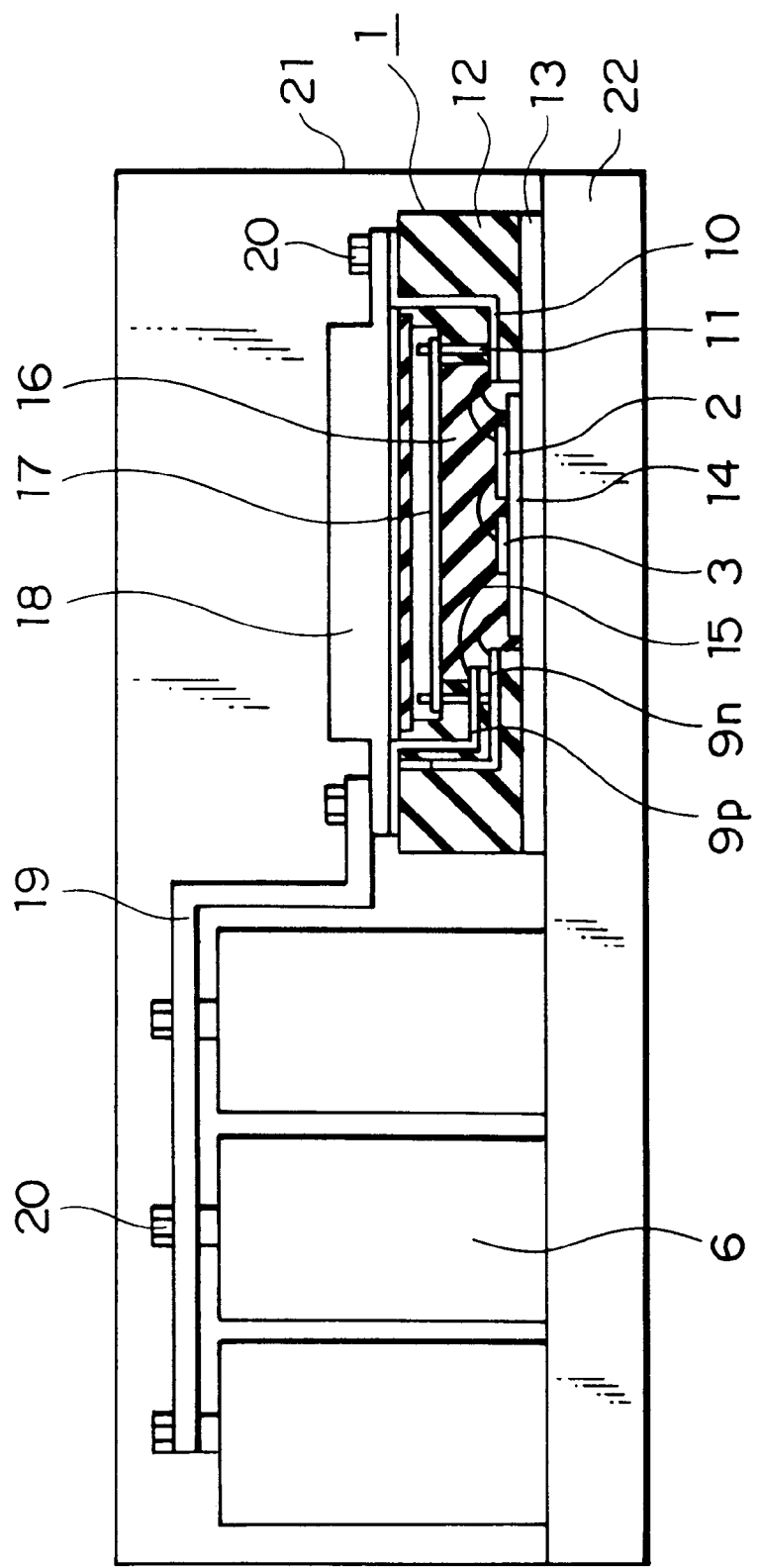
FIG. 6 is a side-elevational and cross-sectional view showing an internal configuration of a privately known but unpublished power conversion apparatus.

FIG. 1 is a block diagram showing a circuit arrangement of a power conversion apparatus according to a first embodiment of this invention. In FIG. 1, an difference of this circuit arrangement from the related example shown in FIG. 5 is that, as a smoothing capacitor 6, a ceramic capacitor is used instead of the aluminium electrolytic capacitor. Thus, in this embodiment, the smoothing capacitor, namely the ceramic capacitor, is marked with reference numeral 6A. Additionally, in this embodiment, the snubber capacitor 4 is not put to use. FIG. 2 is a side-elevational cross-sectional view showing an internal configuration of the power conversion apparatus according to the first embodiment of this invention, while FIG. 3 is a plan view showing the internal configuration of the power conversion apparatus according to the first embodiment of this invention. Instead of the related example shown in FIG. 6, in FIG. 2, a wiring board 19 for establishing the connection between a switching power module 1 and a smoothing capacitor 6 is shortened considerably and the snubber capacitor substrate 18 in the related art is not put to use.

In FIGS. 2 and 3, reference numeral 23 represents a smoothing capacitor case, numeral 24 designates a smoothing capacitor assembly (ASSY) in which the case 23, the smoothing capacitors 6A and the switching power module connection wiring boards 19 are integrated with each other.

In this embodiment, a large-sized and large-capacity chip ceramic capacitor is employed as the smoothing capacitor, and a plurality of ceramic capacitors 6A are connected in parallel with each other for securing an electrostatic capacity required for smoothing a direct-current power supply. These plurality of ceramic capacitors 6A and the switching power module connection wiring boards 19 are stored in the smoothing capacitor case 23 to constitute the smoothing capacitor assembly 24. The plurality of ceramic capacitors 6A and the switching power module connection wiring boards 19 are fixed and electrically connected to each other through the use of an adhesive member such as an electrical conductive adhesive. In the manufacturing process, after the ceramic capacitors 6A and the switching power module connection wiring boards 19 are connected to each other, they are put in the smoothing capacitor case 23. Accordingly, the connection work can be done outside the case 23, hence the fabrication thereof is facilitated.

Furthermore, the plurality of ceramic capacitors 6A are arranged to define a predetermined gap therebetween so that each of the ceramic capacitors 6A does not receive the influence of radiant heat from the other close thereto. For the ceramic capacitor 6A, its internal resistance and internal inductance are in the order of approximately 1/10 with respect to those of an aluminium electrolytic capacitor; therefore, the electrostatic capacity is reducible considerably, thus reducing the area and volume of the smoothing capacitor. Additionally, because of the use of a solid dielectric substance, there is no need to worry about the leakage of electrolyte caused by impairment of sealing function, and the service life is prolongable, thus enhancing the reliability. In the conventional art, the internal resistance of the aluminium electrolytic capacitor is high, and there is a need to increase the electrostatic capacity for suppressing the heat generation of the capacitor itself. However, with the ceramic capacitor 6A, the size reduction and upgrade in reliability of the power conversion apparatus are realizable.

In addition, the reduction of the area and volume of the smoothing capacitor 6A enables the wiring board 19 for connection between the switching power module 1 and the smoothing capacitor 6A to be shortened considerably; consequently, the wiring inductance between the switching devices 2 and the smoothing capacitors 6A is reducible, and the ceramic capacitor having an excellent frequency characteristic is used as the smoothing capacitor 6A so that the surge occurring at switching is suppressible in the vicinity of the switching device 2; consequently, it is possible to remove the snubber capacitor 4 and the snubber capacitor substrate 18, which have been required in the related art.

Furthermore, as a capacitor having a low internal resistance and an excellent frequency characteristic and using a solid dielectric substance, in addition to the ceramic capacitor, there is a film capacitor. However, the film capacitor shows a narrow operating temperature range, and its upper limit is commonly 105° C. instead of 125° C. of the ceramic capacitor, thus difficulty is encountered in using it in operational environments such as high-temperature conditions for motor vehicles and others. Additionally, in general the film capacitor has a lower electrostatic capacity per unit volume as compared with the ceramic capacitor, and the size of the film capacitor becomes larger than that of the ceramic capacitor even at the same electrostatic capacity. For this reason, employing a ceramic capacitor as the smoothing capacitor is preferable as described in the first embodiment.

As described above, in this embodiment, as the smoothing capacitor, a ceramic capacitor is used which has as an internal resistance and an internal inductance as low as approximately 1/10 of those of the related aluminium electrolytic capacitor; therefore, the size of the smoothing capacitor is reducible and the shortening of the switching power module connection wiring board 19 is possible, which in its turn accomplish the size reduction of entire power conversion apparatus.

In addition, owing to the shortening of the switching power module connection wiring board 19, the wiring inductance between the switching device 2 and the smoothing capacitor 6A can be reduced, and the ceramic capacitor shows a good frequency characteristic, which restrains the surge occurring at switching.

The restraint of the surge permits the removal of the snubber capacitor 4 and the snubber capacitor substrate 18, which contributes to the facilitation of the manufacturing process and further to the reduction of manufacturing cost. Additionally, the restraint of the surge allows the direct-current power supply voltage to be set at a value higher for enlarging the controllable range of the alternating-current load 8. Still additionally, the restraint of the surge can lower the withstand voltage of the switching device 2, thereby leading to the size and cost reduction of the switching device 2. Moreover, since the surge is restrainable and the jumping of the direct-current power supply is suppressible at switching, the switching speed becomes higher; the loss of the switching device 2 is reducible, and when the carrier frequency is set at a predetermined higher value, the controllability is improvable and the noise at switching is suppressible.

Furthermore, with the smoothing capacitor assembly 24 in which the ceramic capacitors 6A, the smoothing capacitor case 23 capable of accommodating a plurality of ceramic capacitors 6A and the switching power module connection wiring board 19 are integrated structurally with each other, attachment/detachment and replacement work can be facilitated.

Since a predetermined gap is defined between the plurality of ceramic capacitors 6A, it is possible to prevent each of the ceramic capacitors 6A from receiving the influence of radiant heat from the others close thereto.

In addition, since the connection between the ceramic capacitors 6A and the switching power module connection wiring board 19 is with an adhesive member such as an electrically conductive adhesive, the troublesome screwing work is eliminable, thus accomplishing easier fabrication.

Still additionally, since the ceramic capacitors 6A employ a solid dielectric substance, there is no need to worry about the electrolyte leakage caused by the impairment of sealing function; whereupon, the service life is prolongable and the reliability is improvable.

Second Embodiment

Figure 4:
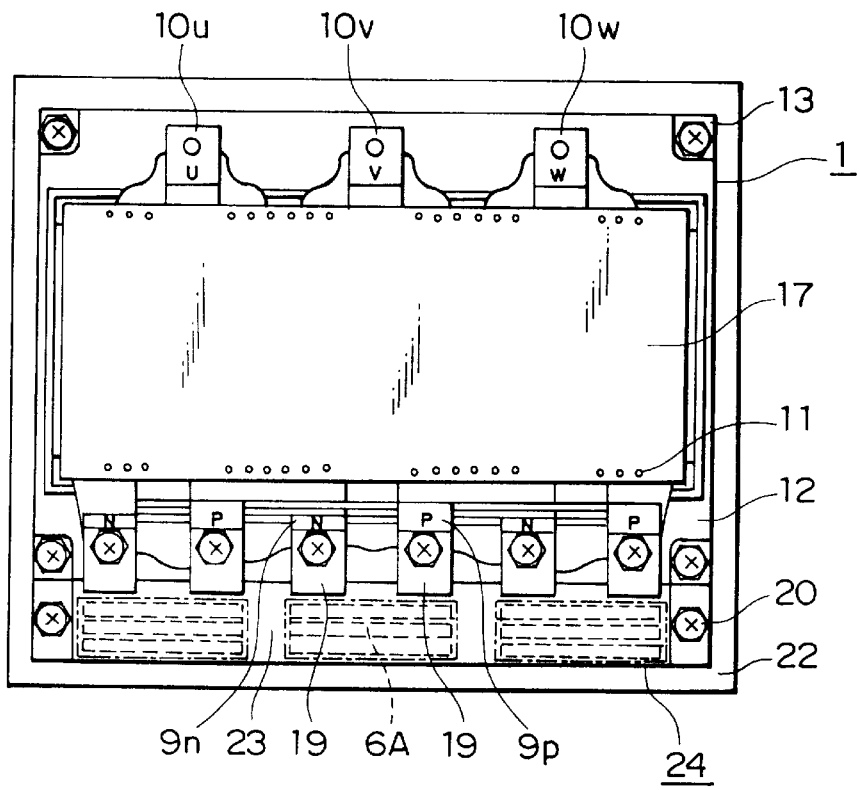
FIG. 4 is a plan view showing an internal configuration of a power conversion apparatus according to a second embodiment of this invention.

FIG. 4 is a plan view showing an internal configuration of a power conversion apparatus according to a second embodiment of this invention. As FIG. 4 shows, three sets of smoothing capacitors 6A and positive-electrode (P) and negative-electrode (N) direct-current input wirings (wiring sections) 9p, 9n are provided to be located in a divided condition for the U, V and W phases of the alternating-current output. Hence, it is possible to fairly reduce the inductance between the switching device 2 and the smoothing capacitor 6A in each of the U, V and W phases of the alternating-current output, which sharply suppresses the surge occurring at switching operation. Additionally, the path of transient current flowing at switching reaches a minimum, and thus the snubber effect is obtainable and the switching noise is reducible. The other configuration is the same as that of the foregoing first embodiment, and the description thereof will be omitted here.

As described above, this embodiment can offer the effects similar to those of the above-described first embodiment, and further, since the smoothing capacitors 6A, the switching power module connection wiring board 19 and the positive-electrode (P) and negative-electrode (N) direct-current input wirings 9p, 9n of the switching power module 1 are located in a divided condition to the U, V and W phases of the alternating-current output, the wiring inductance between the switching devices 2 and the smoothing capacitors 6A is reducible considerably in the respective U, V and W phases of the alternating-current output so that the surge occurring at switching is suppressible significantly, and even, since the transient current path arising at the switching can be shortened to a minimum, the switching noise is reducible.

Incidentally, the power conversion according to this invention is not limited to the above-described first and second embodiments, and if the integrated smoothing capacitor assembly 24 is replaced, the power conversion apparatus is also applicable to various cases. For example, depending upon systems to be constructed, in the case in which the distance between the direct-current power supply 7 and the power conversion apparatus is long, or in the case in which a need exists to increase the regenerative current di/dt of the alternating-current load 8, although there is a need to increase the electrostatic capacity of the smoothing capacitor 6A. However, in this case, by replacing the smoothing capacitor assembly 24 with a large-capacity type, the smoothing effect is attainable readily.

In addition, although the smoothing capacitor generally generates heat due to the ripple current occurring at switching, in this invention, because of the use of a ceramic capacitor having a low internal resistance as the smoothing capacitor 6A, the self heat generation of the capacitor itself reduces, as compared with the related art. However, in a case of using under an environment such as a high-temperature condition in a motor vehicle or the like, the operating temperature margin becomes narrow. That is, for the restraint of the self heat generation, there is a need to further increase the electrostatic capacity of the smoothing capacitor 6A or to cool it by some means. In this invention, in order to meet the requirements of this sort, as shown in FIGS. 3 and 4, the smoothing capacitor assembly 24 is fixed to a cooling member 22 for cooling the switching power module 1 through the use of screws 20 so that the Joule heat developing due to the self heat generation of the smoothing capacitors 6A is shifted through the smoothing capacitor case 23 to the cooling member 22, thus cooling the smoothing capacitors 6A.

As has been described in the first and second embodiments, since the size reduction of the smoothing capacitor is feasible and the considerable shortening of the wiring board for connection between the switching power module and the smoothing capacitors is possible, considerable reduction of the power conversion apparatus is achievable. Additionally, the size reduction of the smoothing capacitor and the shortening of the wiring board can reduce the wiring inductance between the switching device and the smoothing capacitor, and the use of a ceramic capacitor having an excellent frequency characteristic as the smoothing capacitor can restrain the surge occurring at switching, which allows the removal of a snubber capacitor and a snubber capacitor substrate which has been required so far. Still additionally, it is possible to lower the withstand voltage, which contributes to the size reduction of the switching device and to the drop of the cost. Alternatively, if the direct-current power supply voltage is set at a relatively high value, the controllable range of an alternating-current load is enlargeable. Moreover, since the jumping of the direct-current power supply at switching is suppressible to gain the switching speed, the loss of the switching device is reducible, and the controllability is improvable and the noise at switching is suppressible with the carrier frequency being set at a relatively higher value. Still moreover, since the ceramic capacitor employs a solid dielectric substance, no worry exists about electrolyte leakage from deterioration of sealing function, and the service life is prolongable and the reliability is improvable.

Furthermore, since the ceramic capacitor, the smoothing capacitor case and the switching power module connection wiring board are integrated structurally with each other to form a smoothing capacitor assembly, it is possible to easily install smoothing capacitors each having an electrostatic capacity meeting requirements. In addition, the wiring inductance between the switching device and the smoothing capacitor is reducible significantly in each of the U, V and W phases of the alternating-current output, thereby considerably limiting the surge occurring at switching. Still additionally, since the path of the transient current flowing at switching is shortened to a minimum, the switching noise is reducible. Moreover, it is possible to eliminate the need for troublesome screwing work, which enables easy fabrication. Still moreover, use under environments such as a high-temperature condition in a motor vehicle or the like becomes feasible, convenience or utility is improvable and the reliability rises.

It should be understood that the foregoing relates to only preferred embodiments of the present invention, and that it is intended to cover all changes and modifications of the embodiments of the invention herein used for the purpose of the disclosure, which do not constitute departures from the spirit and scope of the invention.

What is claimed is:

1. A power conversion apparatus comprising:
   a switching power module for converting direct current into alternating current using a control circuit and a plurality of switching devices;
   a smoothing capacitor for smoothing a direct-current power supply output to be applied to said switching power module;
   a switching power module connecting wiring board for connecting said smoothing capacitor to said switching power module, and
   a smoothing capacitor case accommodating a plurality of ceramic capacitors, wherein said ceramic capacitors, said smoothing capacitor case and said switching power module connection wiring board are integrated structurally with each other to form a smoothing capacitor assembly,
   wherein said smoothing capacitor comprises a ceramic capacitor.

2. The power conversion apparatus according to claim 1, wherein a plurality of sets of smoothing capacitors, switching power module connection wiring boards and positive-electrode (P) and negative-electrode (N) direct-current input wiring sections are provided to be located in a divided condition for each phase of an alternating-current output, and the number of said sets is the same as that of said phases of said alternating-current output.

3. The power conversion apparatus according to claim 2, wherein a predetermined gap is defined between said plurality of ceramic capacitors so that each of said ceramic capacitors is not affected by radiant heat from the other ceramic capacitor close thereto.

4. The power conversion apparatus according to claim 2, wherein said plurality of ceramic capacitors and said switching power module connection wiring board are connected to each other through an electrically conductive adhesive material.

5. The power conversion apparatus according to claim 1, further comprising cooling means for cooling said smoothing capacitor,
   wherein said smoothing capacitor is fixed to said cooling means so as to cool said smoothing capacitor via said smoothing capacitor case.

* * * * *